United States Patent
Rose et al.

(10) Patent No.: US 6,833,504 B2
(45) Date of Patent: Dec. 21, 2004

(54) HOUSING FOR THE INSTALLATION OF ELECTRICAL AND ELECTRONIC COMPONENTS

(75) Inventors: Friedhelm Rose, Westfalica (DE); Matthias Rose, Rintein (DE)

(73) Assignee: Rolec Gehause-Systeme GmbH (DE)

( * ) Notice: Subject to any disclaimer, the term of this patent is extended or adjusted under 35 U.S.C. 154(b) by 0 days.

(21) Appl. No.: 10/466,536

(22) PCT Filed: Jan. 9, 2002

(86) PCT No.: PCT/DE02/00065

§ 371 (c)(1),
(2), (4) Date: Jul. 16, 2003

(87) PCT Pub. No.: WO02/056437

PCT Pub. Date: Jul. 18, 2002

(65) Prior Publication Data

US 2004/0050572 A1 Mar. 18, 2004

(30) Foreign Application Priority Data

Jan. 16, 2001 (DE) ......................................... 101 01 618

(51) Int. Cl.[7] .................................................. H05K 5/00
(52) U.S. Cl. ....................... 174/52.1; 174/52.3; 16/221
(58) Field of Search ............................... 174/52.1, 52.3, 174/52.4, 50; 312/223.1, 223.2; 16/221, 225, 227, 254, 255, 268

(56) References Cited

U.S. PATENT DOCUMENTS 3,441,975 A * 5/1969 Shepherd ..................... 16/225
4,574,425 A * 3/1986 Sugiura ......................... 16/225
5,133,108 A   7/1992 Esnault
5,513,909 A * 5/1996 Teich ....................... 312/351.6
5,539,955 A * 7/1996 Wiese ........................... 16/225

FOREIGN PATENT DOCUMENTS

| DE | 2 029 983      | 12/1971 |
| DE | 92 16 735 U1   | 3/1993  |
| DE | 196 00 260 C1  | 5/1997  |
| DE | 199 24 168 A1  | 11/2000 |
| GB | 1 306 649      | 2/1973  |

* cited by examiner

*Primary Examiner*—Dean A. Reichard
*Assistant Examiner*—Carmelo Oliva
(74) *Attorney, Agent, or Firm*—Synnestvedt Lechner & Woodbridge, LLP; Richard C. Woodbridge, Esq.; Roy Rosser

(57) ABSTRACT

The present invention relates to a housing for the installation of electrical components comprising a lower section and a cover connected to each other in a hinged manner by at least two flexible inner elements separated from each other outside the housing interior. The ends of the inner elements have a greater cross-section than the region lying between said ends and at least one of the ends is elastically embodied for a temporary reduction in cross-section. Openings leading into each other are provided in the cover and in the lower section, the cross-section of which permits access of the at least one end in the compressed state.

10 Claims, 2 Drawing Sheets

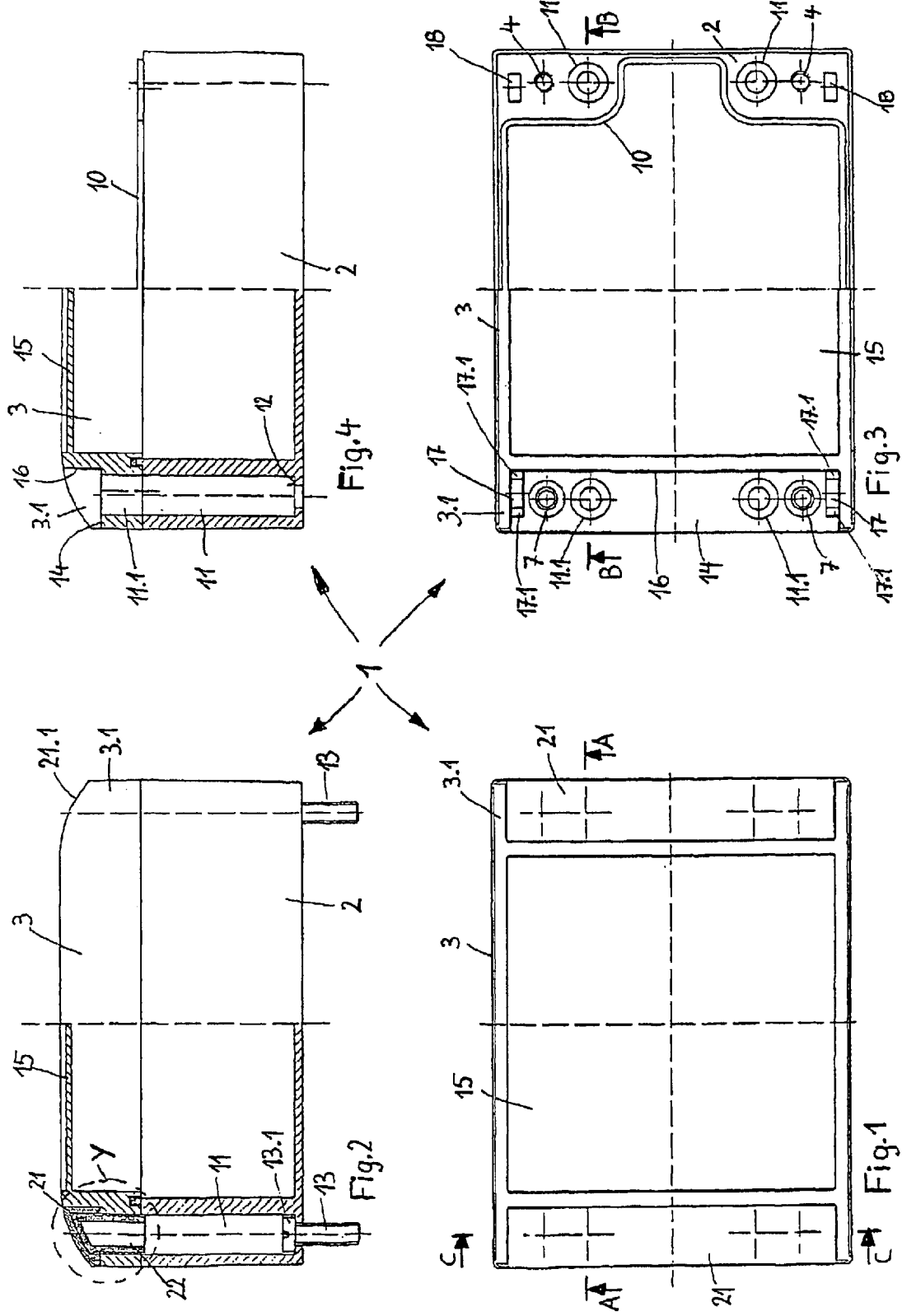

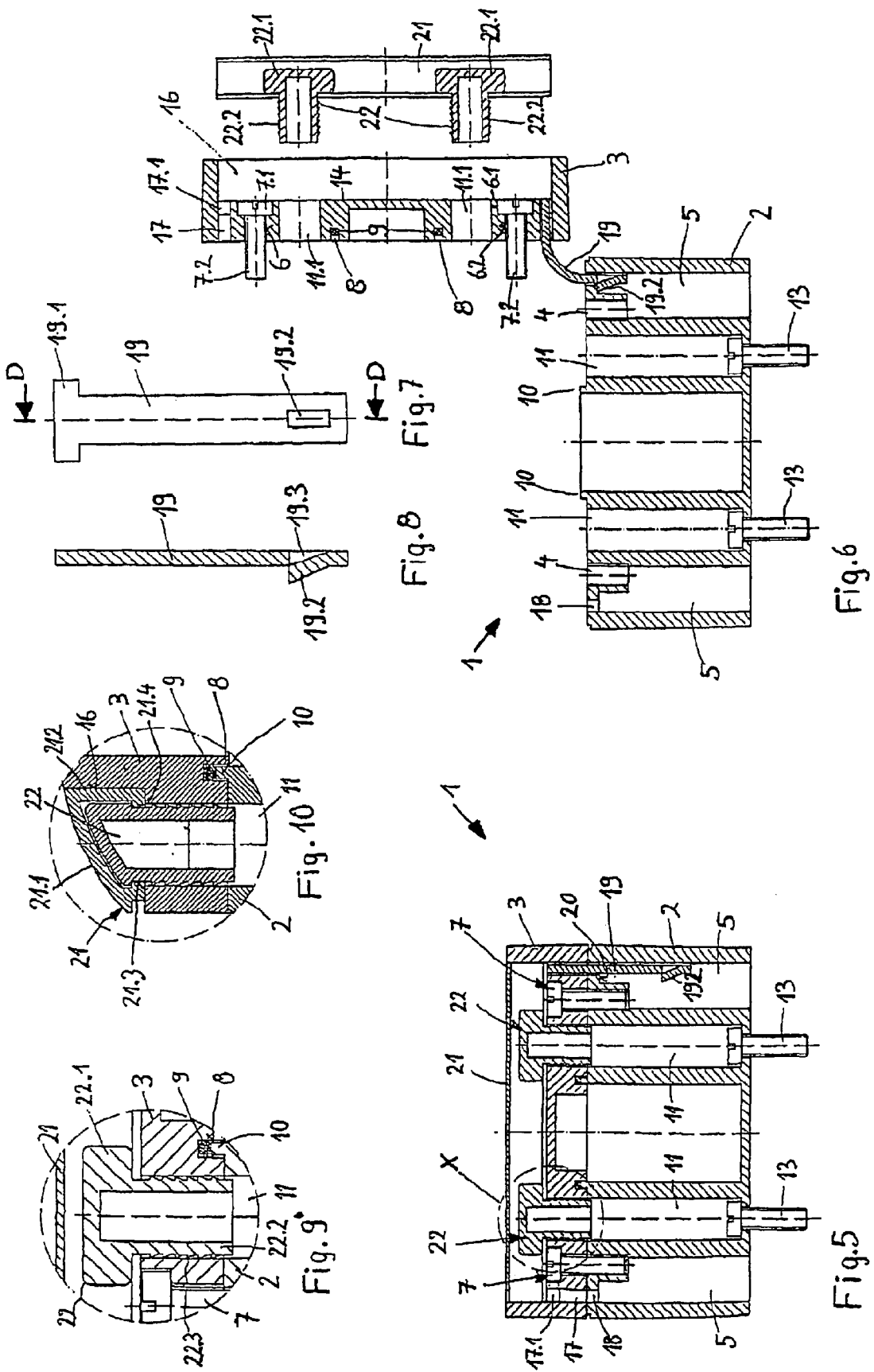

US 6,833,504 B2

HOUSING FOR THE INSTALLATION OF ELECTRICAL AND ELECTRONIC COMPONENTS

BACKGROUND OF THE INVENTION

The present invention relates to a housing, in particular for the installation of electrical and electronic components, consisting of a housing lower section and a cover, fixable thereto, for the installation of electrical and electronic components.

Commercially available housings, primarily made from aluminium but sometimes also from glass-fibre reinforced polyester or thermoplastic materials are provided in the lower section of the housing in the regions of the corners with a tapped hole for affixing a cover which is provided, for this purpose, with through bores with a lowering for the screw head. For reasons of saving material and weight a canal is provided adjacent to the tapped holes axially aligned with said holes and extending through to the bottom side of the lower section, the clear widths of said canal being larger than the cross-section of the tapped hole. One mounting canal each extends in parallel to the aforesaid canals and usually immediately adjacent to them, extending from the top side of the lower section through to the bottom side of the lower section. This canal serves for mounting the lower section to a support. At its lower end it is stepped down to a smaller clear width, thus creating a circular bearing surface for a screw head.

Users of such housings often have the desire to connect the housing lower section and the cover in such a manner that a cover hinge ensues. Often, electrotechnical and/or electronic components are mounted in the housing lower section and in the cover, such components being connected to each other by cables or wire buses. It is important to avoid that such connections are subjected to tearing when the cover is open. Hereby, for various reasons, users of housings prefer internally disposed cover hinges, i. e. hinges which are not visible on the outside when the cover is closed.

These demands are met by a metal wire hinge disclosed in DE 92 16 735 U1. Said hinge consists of a piece of metal wire one end of which is rolled into a cover screw. Said cover screw, for this purpose, is provided with an axial pocket bore into which the piece of wire is inserted prior to rolling-in. A thread plug is rolled-in to the other end of the metal wire in a similar manner, the cross-section of the thread of said plug co-inciding with that of the cover screw. Thus, the cover screw and the thread plug are connected with the piece of metal wire in a torsionally fixed manner. In order to assemble the hinge, the end comprising the thread plug is slid through the cover bore and then screwed through the thread bore in the housing lower section provided for the cover screw. As the thread bore, as explained above, widens into a canal towards the bottom, the metal wire hinge in total drops into the canal up to a point where the cover screw comes to rest with its lower end on the housing lower section. Now, the metal wire hinge can be drawn back only up to the point where the upper end of the thread plug comes to rest against the lower end of the thread bore. The cover screw can now be screwed into the thread bore of the housing lower section. This mounting procedure is repeated at the other end of the same side of the housing. Now, the other cover screws may be screwed in.

To open the cover all cover screws, including those integrated into the metal wire hinge, are unscrewed from the thread bores of the housing lower section. The cover can then be pivoted about its hinge side. Hereby the metal wires are pulled out of the canals up to the point where the top sides of the thread plugs come into contact from below with the thread bores. Thus, the thread plugs in conjunction with the lower side of the thread bores act as stoppers. Hereby, the length of the pieces of metal wire is dimensioned such that the desired angle of pivoting for the cover is attained. The cover is held at its outer side by the cover screws of the metal wire hinge which rest in the cover bores.

In practice it has become apparent that such known metal wire hinges are subject to disturbance as the roll-ins of the ends of the metal wires are not always securely fixed. Moreover, such hinges are relatively costly to manufacture.

A further disadvantage is that the above described metal wire hinge must be held available by housing manufacturers with differing screw heads (slotted head, interior hexagonal head, as desired by the customer). Expenditure for warehousing is still increased by the fact that various lengths of cover screws are required for different cover thicknesses.

A housing described in DE-OS 20 29 983 bears the same or similar disadvantages. Hereby, the connecting member of cover and housing lower section consists of a knurled actuator button to which one end of a flexible shaft, preferably made from thermoplastic material, is affixed. Said shaft runs in the mounted state through an elongated tube which is rotatable and axially displaceable in relation to the shaft. At the other end of the shaft a cap is affixed by a screw connection.

In order to affix the cover to the housing lower section, initially the shaft of the connecting member with the actuator button affixed thereto is inserted from above through a through bore in a corner of the cover. Subsequently, the tube is slid onto the shaft from below and the cap is screwed onto the end of the shaft facing away from the actuator button. Now, the tube can no longer slide off from the shaft as the cross-section of the cap is larger than the smallest interior cross-section of the tube in its upper area. The lower area of the tube which is provided with a thread on its outside is now screwed into a thread bore of the housing lower section. To this end, a central section of the tube is provided in hexagonal shape such that an open end wrench can be used. Now, the cover is placed on top. The tube is so long that its upper end provided with the outside thread extends into the through bore of the cover. The actuator button is provided with a downward protrusion in the shape of a hollow cylinder with an interior thread. By means of said thread the actuator button is screwed onto the upper end of the tube, thus firmly affixing the cover to the housing lower section. The connection described is realized in identical form in the other corner of the same side of the housing.

In order to detach the connection, the actuator buttons are unscrewed from tubes. As the shafts are of sufficient length, the cover can be lifted off the housing lower section and tilted up to the point where the caps come to rest against the smaller interior cross-sections of the tubes. The cover is now suspended from the housing lower section and cannot become lost.

A further interior hinge to be disposed in the screwing canal of a housing is described in DE 196 00 260 C1. Said interior hinge comprises each a tubular upper member and a lower member whereby said two members are connected with each other in the form of a hinge. The lower member is provided with a interior and an exterior thread. The exterior thread is screwed into the housing lower section. In order to affix the cover to the housing lower section, a screw is inserted through the tubular interior hinge and screwed into the interior thread of the lower part of the interior hinge at its lower end. The upper interior hinge member is also provided with an interior thread of the same cross-section as the interior thread of the lower interior hinge member. In order to detach the cover, the screw is unscrewed from the interior thread of the lower interior hinge member. Upon lifting the cover from the housing lower section the screw in the upper interior hinge member is displaced up to the point where the thread member comes to rest against the interior thread of the upper interior hinge member.

Then, based upon the flexible connection between the upper and the lower interior hinge member, the cover is suspended from the housing lower section.

DE 199 24 168 A1 describes a fixation device for connecting two housing halves of an installation device. In this fixation device an first housing half is provided with at least one bolt rod the end of which is provided with at least one snap hook. The second housing half is provided with a connector platform with a recess suitable for inserting the snap hook. The recess is provided with an undercut for arresting the snap hook.

It is the object of the present invention to define a housing in accordance with the type described above which overcomes the described disadvantages.

This task is solved in accordance with the invention by a housing comprising a housing lower section and a cover connected to each other in a hinged manner by at least two flexible inner elements that are separated from each other outside the sealed inner chamber of the housing, wherein the ends of the flexible inner elements have a greater cross-section than the region between the ends, whereby at least one of the ends is elastically embodied by a temporary reduction in cross-section and, through openings leading into each other, are positioned in the cover and the housing lower section, the cross-section of which permits access of the at least one end in the compressed state, which end, after access through the corresponding through opening, increases in cross-section again through elastic relaxation.

The housing in accordance with the invention allows for very simple and quick assembly of its flexible interior elements which serve, when the cover is open, as tension relief for cable connections between components mounted in the housing lower section and in the cover. If both ends of these elements are provided with a compressible thickening these must be slid from below or above respectively through the through openings in the cover or the housing lower section respectively until the compressible thickenings, having passed the through openings, re-expand and lock behind the edges of the openings. Following this assembly procedure the cover is affixed to the housing lower section in the manner of a hinge.

It goes without saying that the lockings are dimensioned in strength such that they do not yield under the load of the cover and components possibly mounted therein hanging from the flexible interior elements, i. e. guarantee safe hold of the opened cover on the housing lower section. Hereby, the opening angle of the cover is determined by the length of the flexible elements, as known in the state of the art. If only one end of the flexible elements is provided in compressible form and the other in more or less rigid form, the assembly must be carried out such that the flexible element with its compressible end is slid successively through the through openings of the cover and the housing lower section, or vice versa, until it snaps back and locks behind the edge of the opening of the cover or the housing lower section respectively.

In an advantageous embodiment of the invention the flexible interior elements are designed as injection moulded plastics member with an integrated compressible lock element at one end and an integrated thickening at the other end. Such an injection moulded member is very inexpensive to produce so it can be packed with each housing as an option for the user of the housing without extra charge. With all prior known solutions users of housings must pay an additional price for the flexible hinge elements as they are relatively expensive to manufacture.

Furthermore, it is advantageous to design the through openings in the cover to receive the integrated thickening in a form-fit and flush manner. Thus, this end of the flexible elements does not protrude from the surface of the area of the cover surrounding the through opening. At the same time, it closes the cross-section of the through opening so that an optically pleasing appearance ensues.

Advantageous further aspects of the invention will become apparent from the following detailed description.

BRIEF DESCRIPTION OF THE DRAWINGS

FIG. 1 a top view of a housing with closed cover with slipped over covering profiles;

FIG. 2 a section A—A according to FIG. 1, showing only the section of the left half of the housing;

FIG. 3 a top view of the housing showing the right half of the housing with detached cover and the left half of the housing with closed cover but detached covering profile;

FIG. 4 a section B—B according to FIG. 3 showing only the left half of the housing in section;

FIG. 5 a section C—C according to FIG. 1;

FIG. 6 representation according to FIG. 5 with opened cover;

FIG. 7 a representation of a flexible interior element in a front view;

FIG. 8 a section D—D according to FIG. 7;

FIG. 9 a detail X according to FIG. 5 in larger scale; and

FIG. 10 a detail Y according to FIG. 2 also in larger scale.

DETAILED DESCRIPTION OF THE INVENTION

The housing 1 shown in the drawing is an aluminium housing of a basic rectangular layout. Said housing 1 consists of a housing lower section 2 closed at the bottom and opened at the top as well as a cover 3 for closing the housing lower section 2. In each of the four corners of the housing lower section 2 a thread bore 4 is provided which opens towards the bottom into a canal 5 which extends through to the lower side of the housing lower section 2. Said thread bores 4 serve for screwing the cover 3 onto the housing lower section 2. To this end the cover 3 is provided with stepped through bores 6 comprising an upper sink area 6.1 to receive the screw head 7.1 of a cover screw 7 followed by a bore area 6.2 which, when the cover is screwed tight, is filled by the screw shaft with a little radial clearance. When all four cover screws 7 are screwed tight the cover 3 is firmly affixed to the housing lower section 2. A groove 8 running around the cover with an inlaid seal 9 and a ledge 10 running around the housing lower section 2 and engaging into the groove 8 ensure a tight fit of the cover 3 on the housing lower section 2.

In the region of each corner of the housing lower section 2 a mounting canal 11 runs adjacent to the canal 5 and parallel to this, said mounting canal having a larger diameter in its upper region than in its lower region, thus creating a shoulder 12 there which provides a stop for the head 13.1 of a mounting screw 13 by means of which the housing lower section 2 can be screwed to, for example, a wall. The mounting canals 11 continue upwards inside the cover 3 in sections 11.1, terminating here in a level 14 lying below the cover surface 15 created by a corresponding step 16 of the edge region of the cover. Said level 14 extends across the entire width of the cover and is terminated laterally by protrusions 3.1 of the lateral wall of the cover 3. It is provided in identical form on two opposing sides of the cover. The levels 14 are also the termination point of the sink region 6.1 of the through bores 6 for the cover screws 7. When the cover 3 is placed on the housing lower section 2 and the cover screws 7 are screwed tight the upper faces of the screw heads 7.1 are flush with the level 14 (FIG. 5).

In the corners of the cover 3, besides the thread bores 4 and the protrusions 11.1 of the mounting canals 11, further through bores 17 are provided which lead into corresponding through bores 18 in the housing lower section 2. Whereas the through bores 17 at their upper ends terminate in level 14, the through bores 18 terminate at their lower ends in the canals 5. Both through bores 17, 18 exhibit an identical rectangular cross-section which widens at the upper ends of the through bores 17 by lateral protrusions 17.1 in the shape of a hammer head. Like the through bores 6, the thread bores 4, the canals 5, the mounting canals 11 and their protrusions 11.1, said through bores are disposed outside the sealed interior space of the housing 1, the borders of which are defined by the groove 9 and key 10 running around the cover 3 and the housing lower section 2 respectively. This design can best be seen from FIG. 5.

The through openings 17, 18 serve to receive and affix hinge bands 19. Such a hinge band 19 is shown in detail in FIGS. 7 and 8. This is an injection-moulded element made of flexible plastics material. Its cross-section in the regions lying between the two ends is adapted to the cross-section of the through openings 17, 18 so that this area can easily be inserted through the through openings 17, 18. At both ends the hinge band 19 is provided with areas of thicker cross-sections. At the upper end (viewed as seen in FIG. 7 and 8) this area of thicker cross-section consists of a rigid lateral extension in the shape of a hammer head 19.1, the shape of which is identical with the hammer head extension 17.1 of the through bore 17 so that it can be received by this in a form-fit manner. At the lower end of the hinge band 19 the area of thicker cross-section consists of an injection affixed abutment hook type spring ledge 19.2 capable of being compressed inwards due to a recess 19.3 in the material of the hinge band 19.

The hinge bands 19 serve to connect cover 3 and housing lower section 2 in a hinged manner. They are supplied along with the housing 1 all the time to be optionally used without extra charge as their cost is negligible. Moreover, as it presents no problem upon manufacturing the housing 1 to provide for the through openings 17, 18 in the mould, these openings are also present with all supplied housings without an extra charge. Thus a user of a housing can make a decision after the purchase whether or not to realize a hinge connection of cover 3 and housing lower section 2. In the solutions according to the state of the art the user must make such decision prior to the purchase or upon ordering the housing and pay an extra charge for the required additional components and adaptations at the housing respectively.

The assembly of the hinge band 19 is very easy. Herefor, its lower end, i. e. the end on which the spring ledge 19.2 is disposed, is pressed from the top side of the cover into the through opening 17. Being subjected to corresponding pressure, the spring ledge 19.2 is compressed so that the hinge band 19 can be pressed through the through opening 17 up to the point where its hammer shaped head 19.2 comes into form-fit engagement with the corresponding widening of the cross-section 17.1 at the upper end of the through opening 17. The end of the hinge band 19 protruding towards the bottom is pressed similarly through the through opening 18 in the housing lower section 2. Having passed the through opening 18 the spring ledge 19.2 re-expands. Now, the hinge band 19 can neither be drawn downwards from the through opening 17 nor upwards from the through opening 18, as this is prevented by the wider cross-sections (hammer shaped head 19.1, spring ledge 19.2). A detachment of said connection is only possible if the spring ledge 19.1 is torn off by means of excessive pull or intentionally, for example, by means of a screw driver, pressed from below through the canal 5 in a way compressing its cross-section.

Always two hinge bands 19 are mounted at one side of the housing, and their virtual connecting line provides for the virtual axis of the hinge. Hereby, the user of the housing has the choice to use one or the other side of the housing to mount the hinge bands 19 as the through openings 17, 18 are provided in each corner of the housing.

When the cover 3 is placed on top of the housing lower section 2 the hinge bands 19 are hanging on the cover and their lower ends protrude into canals 5 which are long enough to receive the hinge bands 19. Upon unscrewing of the cover screws 7 the cover 3 can be pivoted outwards about the side of the housing at which the two hinge bands 19 are installed, whereby the hinge bands 19 are drawn out from the canals 15 up to the point where the spring ledges 19.2 come to stop against the lower edge 20 of the through openings 18 thus preventing a further pull out. This situation is shown in FIG. 6. The cover 3 can now be pivoted even further until it is freely suspended from the housing lower section 2 held by the hinge bands 19. The length of pull out of the hinge bands 19 resulting from the spacing between the lower edge 20 of the through openings 18 and the free end of the spring ledge 19.2 is chosen such that tension relief is maintained for any possible cable connections between components mounted in the cover 3 or the housing lower section 2 respectively.

Although the hammer shaped head 19.1 of the hinge bands 19, like the heads 7.1 of the cover screws 7, are flush with the surfaces 14 in the assembled state (FIG. 5), this solution is optically not appealing, all the more so, since also the protrusions 11.1 of the mounting canals 11 lie open in the levels 14. Since these levels 14 lie below the level of the cover surface 15 there is the possibility of covering these areas. Herefore, for each level 14 a cover profile 21 made from aluminium is provided. The length of such cover profile 21 is adapted to the spacing between the protrusions 3.1 of the side walls of the cover 3 such that it fills this space with little lateral clearance. Hereby, the cross-section of the cover profile 21 is designed such that this compensates for the discontinuity in the contours of the cover surface created by the step 16 in the edge region of the cover in that the surface 21.1 of the cover profile lowers, as seen from above, concavely down to the level of the level 14. Corresponding to this curvature the cover profile 21 is provided with a longer interior leg 21.2 and a shorter exterior leg 21.3 (FIG. 10). From the interior leg 21.2 and the exterior leg 21.3 short bars 21.4 protrude perpendicularly towards the interior, said bars serving to hold two plastic holder pins 22 at the cover profile 21. Said holder pins 22 are provided with a head 22.1 as well as a cylindrical shaft 22.2 protruding downwards from the former. The head 22.1 is provided with diametrically opposed grooves 21.3 which allow the holder pins 21 to be inserted laterally into the cover profile 21. Hereby, the holder pins 22 when inserted into the cover profile 21 are secured against being pulled out downwards.

The spacing of the holder pins 22 in relation to the ends of the cover profile 21 is chosen such that their shafts 22.2 are aligned with the protrusions 11.1 of the mounting canals 11. Moreover, the cross-section of the shafts 22.2 is adapted to the cross-section of the protrusions 11.1 such that the holder pins 22 can be impressed relatively easy into the protrusions 11.1 but are still being held securely in said protrusions. In order to safeguard this, the shafts 22.2 are provided all around with abutment hook type lips 22.3 which provide resistance against pulling out of the holder pins 22 from the protrusions 11.1 but allow them to be pulled out where necessary.

Following the mounting of the housing 1 on a surface by screwing the screws 13 tight and screwing the cover 3 onto the housing lower section 2, the cover 3 is completed by pressing on the cover profiles 21 as described above. Thereby ensues a consistent cover surface which is made up from the cover surface 15 and the surface 21.1 of the cover profiles 21. When the housing 1 is to be opened, at first the cover profiles 21 are removed so that there is access to the cover screws 7 which can then be screwed out of the housing lower section 2.

What is claimed is:

1. A housing for the installation of electrical components comprising a lower section, a cover, and a sealed inner chamber, the lower section and cover each comprising openings and being connected to each other in a hinged manner by at least two flexible inner elements that are separated from each other outside the inner chamber, wherein a first end of the inner element comprises a lateral extension, and a second end of the inner element comprises a compressible catch extending orthogonally to said lateral extension, such that the ends of the inner elements have cross-section than the region lying between said ends, and said second end further comprising a recess into which said compressible catch may be compressed for a temporary reduction in cross-section and passed through the openings in the cover and the housing lower section, which openings permit access of said second end in the compressed state.

2. The housing of claim 1, wherein the inner elements are designed as injection-molded plastic members, wherein said lateral extension and said compressible catch are an integral part of said members.

3. The housing of claim 2, wherein the openings in the cover are designed to receive the integrated lateral extension in a flush and form-fitting manner.

4. The housing of claim 3, wherein the injection molded plastic member is realized as a band said lateral extension at said first end extending in the manner of a hammer head, and said compressible catch at said second end is a catch ledge, in the manner of an abutment hook, and the openings in the cover and lower section of the housing being designed in the shape of slots corresponding to the shape of the injection molded plastic member.

5. The housing of claim 4, wherein the openings in the cover are covered at the top.

6. The housing of claim 3, wherein the openings in the cover are covered at the top.

7. The housing of claim 2, wherein the injection molded plastic member is realized as a band said lateral extension at said first end extending in the manner of a hammer head, and said compressible catch at said second end is a catch ledge, in the manner of an abutment hook, and the openings in the cover and lower section of the housing being designed in the shape of slots corresponding to the shape of the injection molded plastic member.

8. The housing of claim 7, wherein the openings in the cover are covered at the top.

9. The housing of claim 2, wherein the openings in the cover are covered at the top.

10. The housing of claim 1, wherein the openings in the cover are covered at the top.

* * * * *

UNITED STATES PATENT AND TRADEMARK OFFICE
CERTIFICATE OF CORRECTION

PATENT NO.    : 6,833,504 B2
DATED         : December 21, 2004
INVENTOR(S)   : Friedhelm Rose and Matthias Rose It is certified that error appears in the above-identified patent and that said Letters Patent is hereby corrected as shown below:

<u>Column 7,</u>
Line 39, should read as follows:
-- elements have a greater cross-section than the region lying --.

Signed and Sealed this

Nineteenth Day of April, 2005

JON W. DUDAS
*Director of the United States Patent and Trademark Office*